United States Patent
Kaneko et al.

(10) Patent No.: US 10,636,627 B2
(45) Date of Patent: Apr. 28, 2020

(54) SUBSTRATE PROCESSING APPARATUS

(71) Applicant: TOKYO ELECTRON LIMITED, Tokyo (JP)

(72) Inventors: Hirofumi Kaneko, Oshu (JP); Tomoyuki Nagata, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 562 days.

(21) Appl. No.: 15/064,856

(22) Filed: Mar. 9, 2016

(65) Prior Publication Data

US 2016/0276206 A1 Sep. 22, 2016

(30) Foreign Application Priority Data

Mar. 19, 2015 (JP) .................................. 2015-055586

(51) Int. Cl.
*H01J 37/32* (2006.01)
*H01L 21/67* (2006.01)
(Continued)

(52) U.S. Cl.
CPC .... *H01J 37/3244* (2013.01); *C23C 16/45591* (2013.01); *H01J 37/32633* (2013.01); *H01J 37/32779* (2013.01); *H01J 37/32834* (2013.01); *H01L 21/67017* (2013.01); *H01L 21/6719* (2013.01); *H01L 21/67109* (2013.01);
(Continued)

(58) Field of Classification Search
CPC ............ H01J 37/3244; H01J 37/32779; H01J 37/32633; H01J 37/32834; H01L 21/67109; H01L 21/67017; H01L 21/67178; H01L 21/67115; H01L 21/67303; H01L 21/6733; H01L 21/6719; C23C 16/45578;
(Continued)

(56) References Cited

U.S. PATENT DOCUMENTS 7,807,587 B2 * 10/2010 Matsuura .......... C23C 16/45525
438/800
2009/0305512 A1 * 12/2009 Matsuura .......... C23C 16/45525
438/758

(Continued)

FOREIGN PATENT DOCUMENTS

JP    2000299287 A    10/2000
JP    2001-077042 A    3/2001
(Continued)

*Primary Examiner* — Jeffrie R Lund
(74) *Attorney, Agent, or Firm* — Nath, Goldberg & Meyer; Jerald L. Meyer (57) ABSTRACT

A substrate processing apparatus includes: a substrate holder which holds a plurality of substrates; a processing vessel including an inner tube and an outer tube disposed outside the inner tube; a gas supply part which supplies a process gas in parallel to target surfaces of the substrates; an exhaust part which exhausts the process gas from the processing vessel through a gas outlet; an exhaust port formed in the inner tube; and a rectifying plate installed in an outer wall of the inner tube or an inner wall of the outer tube between the exhaust port and the gas outlet in a circumferential direction of the processing vessel. The rectifying plate is installed to extend upward from a position below a lower end of the substrate holder to a location corresponding at least to a lower end of the exhaust port.

8 Claims, 11 Drawing Sheets

(51) Int. Cl.
*C23C 16/455* (2006.01)
*C23C 16/458* (2006.01)
*C23C 16/44* (2006.01)

(52) U.S. Cl.
CPC ...... *C23C 16/4412* (2013.01); *C23C 16/4583* (2013.01); *C23C 16/45578* (2013.01); *C23C 16/45587* (2013.01)

(58) Field of Classification Search
CPC .......... C23C 16/4412; C23C 16/45587; C23C 16/45591; C23C 16/4583
See application file for complete search history.

(56) References Cited

U.S. PATENT DOCUMENTS

| | | | |
|---|---|---|---|
| 2010/0218724 A1* | 9/2010 | Okada | C23C 16/4405 118/724 |
| 2011/0253049 A1 | 10/2011 | Fukuda et al. | |
| 2012/0186573 A1* | 7/2012 | Jdira | H01L 21/67109 126/58 |
| 2016/0276206 A1* | 9/2016 | Kaneko | H01J 37/32633 |
| 2017/0114464 A1* | 4/2017 | Iriuda | C23C 16/4584 |

FOREIGN PATENT DOCUMENTS

| | | |
|---|---|---|
| JP | 2009506573 A | 2/2009 |
| JP | 2012178390 A | 9/2012 |
| JP | 2014090212 A | 5/2014 |
| TW | 201447212 A | 12/2014 |
| TW | 201511091 A | 3/2015 |

* cited by examiner

SUBSTRATE PROCESSING APPARATUS

CROSS-REFERENCE TO RELATED APPLICATION

This application claims the benefit of Japanese Patent Application No. 2015-055586, filed on Mar. 19, 2015, in the Japan Patent Office, the disclosure of which is incorporated herein in its entirety by reference.

TECHNICAL FIELD

The present disclosure relates to a substrate processing apparatus.

BACKGROUND

A vertical substrate processing apparatus has been used as a substrate processing apparatus which performs a heat treatment with respect to a plurality of wafers in a batch. In the vertical heat treatment apparatus, wafers are accommodated in a processing vessel and a process gas is supplied from a gas supply part to the wafers so that heat treatment is performed on the wafers.

As a vertical heat treatment apparatus, a configuration is used in which an exhaust port is formed in a sidewall of a processing vessel having a plurality of exhaust zones divided in an arrangement direction of wafers, and a gas introduction pipe for supplying a process gas is installed at a position opposite to the exhaust port with the wafers interposed between the gas introduction pipe and the exhaust port.

However, in such an apparatus, since the exhaust port is formed below the processing vessel, the process gas introduced into the processing vessel is likely to flow downward. As such, a flow of the process gas may be biased to one side within the processing vessel. This degrades in-plane uniformity when performing a heat treatment with respect to a plurality of wafers accommodated in the processing vessel.

SUMMARY

Some embodiments of the present disclosure provide a substrate processing apparatus which suppresses a flow of gas from being biased to one side within a processing vessel.

According to one embodiment of the present disclosure, there is provided a substrate processing apparatus including: a substrate holder configured to hold a plurality of substrates in a shelf formation; a processing vessel including an inner tube configured to accommodate the plurality of substrates and the substrate holder, and an outer tube disposed outside the inner tube; a gas supply part configured to supply a process gas in parallel with respect to target surfaces of the plurality of substrates accommodated in the processing vessel; an exhaust part configured to exhaust the process gas from the processing vessel through a gas outlet; an exhaust port formed in a sidewall opposite to the gas supply part via the substrate holder in the inner tube; and a rectifying plate installed in an outer wall of the inner tube or an inner wall of the outer tube between the exhaust port and the gas outlet in a circumferential direction of the processing vessel, wherein the rectifying plate is installed to extend upward from a position below a lower end of the substrate holder to a location corresponding at least to a lower end of the exhaust port in a vertical direction of the processing vessel.

According to another embodiment of the present disclosure, there is provided a substrate processing apparatus including: a substrate holder configured to hold a plurality of substrates in a shelf formation; a processing vessel including an inner tube configured to accommodate the plurality of substrates and the substrate holder, and an outer tube disposed outside the inner tube; a gas supply part configured to supply a process gas in parallel with respect to target surfaces of the plurality of substrates accommodated in the processing vessel; an exhaust part configured to exhaust the process gas from the processing vessel through a gas outlet; and an exhaust port formed in a sidewall opposite to the gas supply part via the substrate holder in the inner tube. The substrate holder includes: a ceiling plate, a bottom plate installed to face the ceiling plate; a column connecting between the ceiling plate and the bottom plate; an arm portion installed in the column and configured to hold the plurality of substrates; and disk-shaped members installed between the ceiling plate and the plurality of substrates and between the bottom plate and the plurality of substrates, each of the disk-shaped member having an outer diameter larger than that of each of the plurality of substrates.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. Herein, like components having substantially similar functions will be denoted by like reference numerals throughout the specification and the accompanying drawings, and repeated descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Overall Configuration of Substrate Processing Apparatus>

Figure 1:
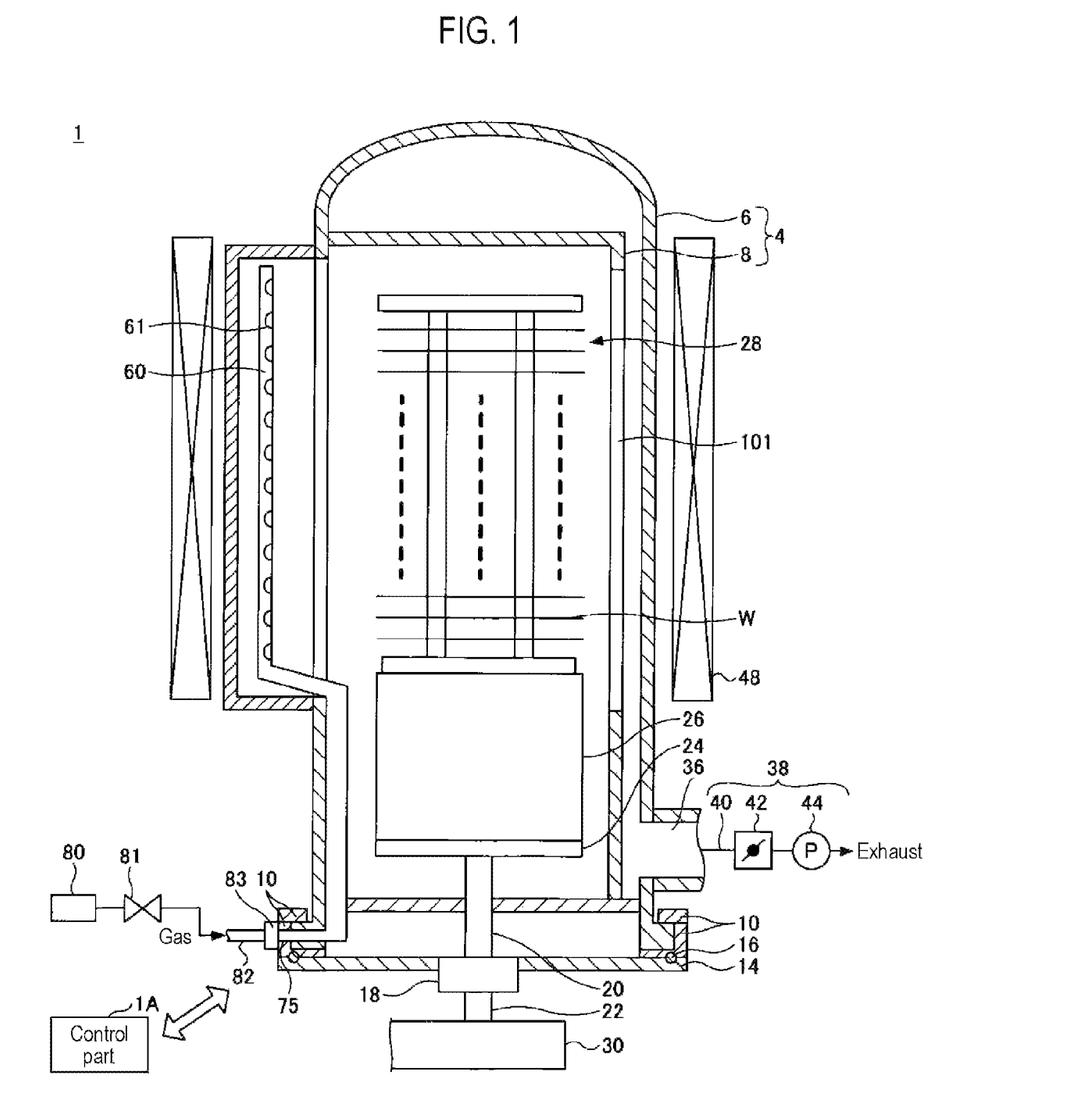
FIG. 1 is a schematic longitudinal sectional view of a substrate processing apparatus according to one embodiment of the present disclosure.

A substrate processing apparatus according to one embodiment of the present disclosure will now be described. FIG. 1 is a schematic longitudinal sectional view of a substrate processing apparatus 1 according to one embodiment of the present disclosure.

As shown in FIG. 1, the substrate processing apparatus 1 includes a substantially cylindrical processing vessel 4, wherein a longitudinal direction of the processing vessel 4 corresponds to a vertical direction. The processing vessel 4 has a double tube structure which is composed of an outer tube 6 having a ceiling and an inner tube 8 having a ceiling and concentrically disposed inside the outer tube 6. A lower end of the inner tube 8 has an outwardly protruding flange and is fixed to an inner wall of the outer tube 6 by welding or the like. A lower end of the outer tube 6 has an outwardly protruding flange. A lower side of the flange of the outer tube 6 is supported by a circular ring-shaped bottom flange 10 formed of stainless steel or the like. The bottom flange 10 is clamped by a base plate with a fixing member such as a bolt or the like. A detailed configuration of the processing vessel 4 will be described below.

The bottom flange 10 is formed at a lower end thereof with an opening, to which a disk-shaped cap 14 formed of, e.g., stainless steel, is air-tightly coupled via a sealing member 16 such as an O-ring. In addition, a rotational shaft 20 is rotatably inserted into a substantially central portion of the cap 14 while maintaining air-tightness by means of, for example, a magnetic fluid seal 18. A lower end of the rotational shaft 20 is connected to a rotating mechanism 22, and an upper end of the rotational shaft 20 is fixed to a table 24 formed of, for example, stainless steel.

A heat insulating tube 26 formed of, for example, quartz is disposed on the table 24. Furthermore, a wafer boat 28 formed of, for example, quartz, which is used as a substrate holder, is mounted on the heat insulating tube 26. The wafer boat 28 used as the substrate holder holds a plurality of wafers W inside the processing vessel 4 in a shelf formation. For example, 50 to 150 sheets of semiconductor wafers W as substrates are accommodated into the wafer boat 28 at predetermined intervals, for example, at a pitch of about 10 mm.

Figure 2:
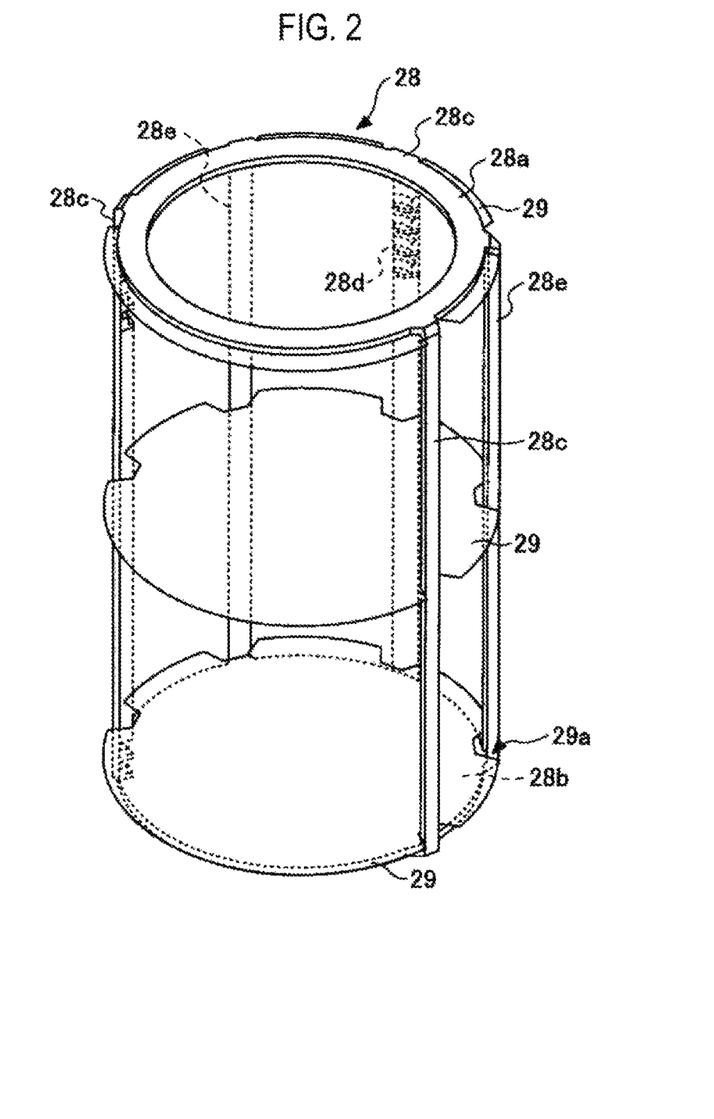
FIG. 2 is a schematic perspective view of an example of a wafer boat.
Figure 3:
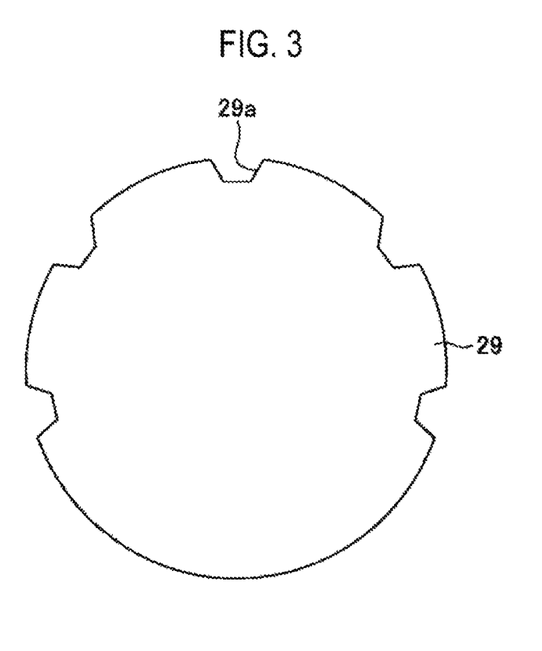
FIG. 3 is a schematic plan view of an example of a disk-shaped member.

FIG. 2 is a schematic perspective view of one example of the wafer boat 28. FIG. 3 is a schematic plan view of one example of a disk-shaped member 29.

For example, as shown in FIG. 2, the wafer boat 28 includes a plurality of (e.g., three) columns 28c interposed between a ceiling plate 28a and a bottom plate 28b. Each of the columns 28c is provided with arm portions 28d for holding the wafers W. In some embodiments, auxiliary columns 28e may be suitably installed to the wafer boat 28 in addition to the columns 28c.

One or more disk-shaped members 29 are respectively installed between the ceiling plate 28a of the wafer boat 28 and an upper region in which some of the plurality of wafers W are held, between the bottom plate 28b of the wafer boat 28 and a lower region in which some of the plurality of wafers W is held, and a central portion of the wafer boat 28 in a vertical direction. In FIG. 2, a single disk-shaped member 29 is installed in a respective space.

For example, as shown in FIG. 3, the disk-shaped member 29 has an outer diameter larger than that of the wafer W, and has notches 29a formed at positions corresponding to the columns 28c and the auxiliary columns 29e of the wafer boat 28. In FIG. 3, five notches 29a are shown to be formed in the disk-shaped member 29. The disk-shaped member 29 is formed of a heat resistant material such as quartz.

In some embodiments, the disk-shaped members 29 may be fixed to the wafer boat 28 by welding or the like, or may be detachably mounted on the wafer boat 28.

The wafer boat 28, the heat insulating tube 26, the table 24 and the cap 14 are integrally loaded into or unloaded from the processing vessel 4 by, for example, a lifting mechanism 30 as a boat elevator.

A gas introduction pipe 82 for introducing a process gas into the processing vessel 4 therethrough is connected to a lateral side of the bottom flange 10. The gas introduction pipe 82 is connected to a gas introduction port 75 by a fixing member such as a joint 83. The flange of the outer tube 6 has a through-hole formed at a position corresponding to the gas introduction port 75. A horizontal portion of an injector 60 is inserted into the through-hole from the interior of the processing vessel 4 so that the injector 60 is connected and fixed to the gas introduction pipe 82 by the joint 83.

The injector 60 is a gas supply part which is configured to supply the process gas supplied into the gas introduction port 75 through the gas introduction pipe 82 toward the wafers W. In some embodiments, the injector 60 may be formed of, for example, quartz, or a ceramic material such as SiC. Alternatively, the injector 60 may be made of various other materials which are hard to contaminate the interior of the processing vessel 4.

A leading end of an upper portion of the injector 60 is sealed. A lateral side of the injector 60 has a plurality of gas supply holes 61 through which the process gas is supplied in parallel with respect to target surfaces of the plurality of wafers W accommodated in the processing vessel 4. In other words, the gas supply holes 61 are formed in the lateral side of the injector 60 at predetermined intervals in a vertical direction and the process gas is supplied into the processing vessel 4 through the gas supply holes 61. And, the wafers W are subjected to a heat treatment so that a film is formed on each of the wafers W. To do this, the gas supply holes 61 are formed to face the wafers W in the injector 60.

While in FIG. 1, the single gas introduction pipe 82 has been shown, the present disclosure is not limited thereto. In some embodiments, the substrate processing apparatus 1 may include a plurality of gas introduction pipes 82 depending upon the number of types of gases used. Further, the gas introduced into the processing vessel 4 through the gas introduction port 75 is supplied from a gas source 80. A flow rate of the gas supplied from the gas source 80 is controlled by a flow rate control valve 81.

In some embodiments, the substrate processing apparatus 1 may include an activation part configured to activate the process gas discharged from the gas supply holes 61 using plasma generated by RF power.

A gas outlet 36 is formed in a lower portion of the outer tube 6. The gas outlet 36 is connected to an exhaust system 38 as one example of an exhaust part. The exhaust system 38 includes an exhaust passage 40 connected to the gas outlet 36, and a pressure adjustment valve 42 and vacuum pump 44 which are sequentially connected to the exhaust passage 40. The exhaust system 38 can exhaust the gas from the processing vessel 4 while adjusting an internal pressure of the processing vessel 4.

A heater 48 is installed to surround an outer periphery of the processing vessel 4 to heat target objects such as the wafers W.

A slit 101 as one example of an exhaust port is formed in a sidewall opposite to the injector 60 via the wafer boat 28 in the inner tube 8. The slit 101 is formed in the vertical direction of the inner tube 8 to exhaust gas from the inner tube 8. In other words, the process gas supplied toward the wafers W through the gas supply holes 61 of the injector 60 flows into a space between the inner tube 8 and the outer tube 6 through the slit 101 of the inner tube 8, followed by being discharged from the processing vessel 4 through the gas outlet 36.

An upper end of the slit 101 is formed to be defined at a position higher than that of the uppermost one among the wafers W held in the wafer boat 28. Furthermore, a lower end of the slit 101 is formed to be defined at a position lower than that of the lowermost one among the wafers W held in the wafer boat 28.

Although in FIG. 1, the slit 101 has been shown as one example of the exhaust port, the present disclosure is not limited thereto. In some embodiments, a plurality of openings formed in the vertical direction of the processing vessel 4 may be used as the exhaust port.

Figure 4:
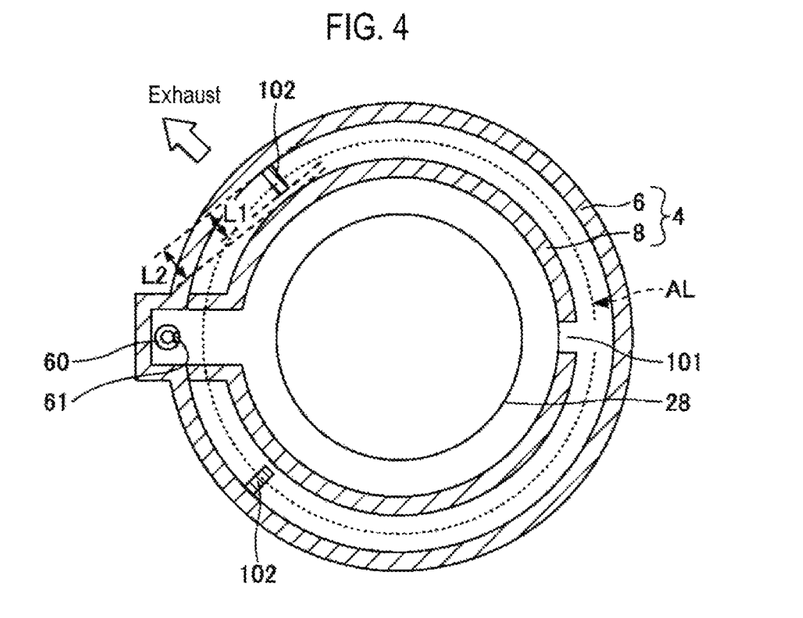
FIG. 4 is a schematic transverse sectional view of a substrate processing apparatus according to an embodiment of the present disclosure.
Figure 5:
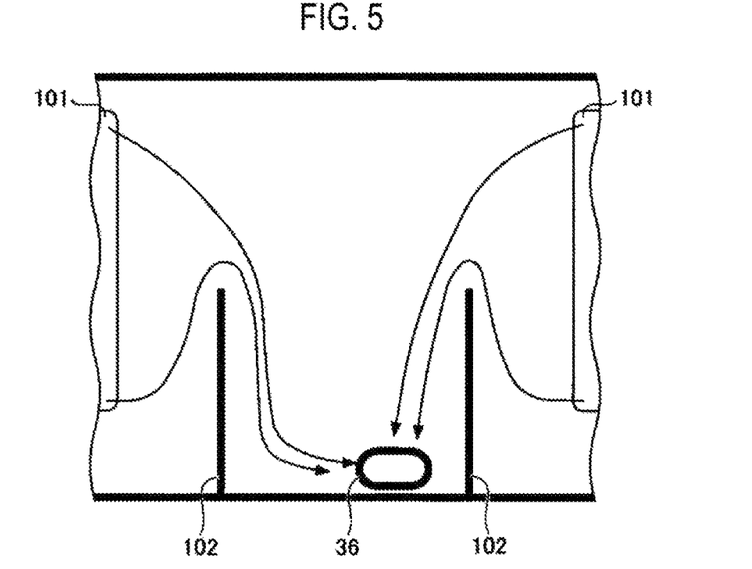
FIG. 5 is a schematic partial developed view along an auxiliary line AL of FIG. 4.

FIG. 4 is a schematic transverse sectional view of the substrate processing apparatus 1 according to an embodiment of the present disclosure. FIG. 5 is a schematic partial developed view along an auxiliary line AL of FIG. 4. In FIG. 4, an arrow indicates a direction in which the exhaust system 38 is disposed. Further, in FIG. 5, an arrow indicates a flow of the process gas.

As shown in FIG. 4, the outer tube 6 includes rectifying plates 102 installed in an inner peripheral wall thereof. The rectifying plates 102 are installed to protrude toward an outer wall of the inner tube 8 by, for example, welding, in a space defined between the slit 101 and the exhaust system 38 (the gas outlet 36) in the circumferential direction of the processing vessel 4. A longitudinal direction of the rectifying plate 102 corresponds to the vertical direction. As shown in FIG. 5, the rectifying plates 102 are installed to extend upward from a position below the lower end of the wafer boat 28 up to a position corresponding at least to the lower end of the slit 101.

Assuming that a length of the rectifying plate 102 when viewed from the top is L1 and a gap between the inner wall of the outer tube 6 and the outer wall of the inner tube 8 is L2, as shown in FIG. 4, the length L1 may be more than 0.67 times the length L2 (L1≥0.67×L2). A height of the rectifying plate 102 in the vertical direction may be set to be a height from the lower end of the inner tube 8 up to approximately the middle portion of the wafer boat 28 in a height direction thereof.

Although in FIG. 4, the rectifying plate 102 has been shown to be installed in the inner wall of the outer tube 6, the present disclosure is not limited thereto. In some embodiments, the rectifying plate 102 may be installed in the outer wall of the inner tube 8 to protrude toward the inner wall of the outer tube 6 (see 102' in FIG. 6A).

Further, as shown in FIG. 1, the substrate processing apparatus 1 includes a control part 1A (e.g., a computer) configured to control an operation of each part of the substrate processing apparatus 1. The control part 1A includes a data processing part composed of a program, a memory, and a central processing unit (CPU). The program stores instructions (steps) for allowing the control part 1A to send control signals to each part of the substrate processing apparatus 1 to execute various processes. The program is stored in a computer-readable storage media such as a floppy disk, a compact disk, a hard disk, a magneto-optical (MO) disk and a memory card or the like and is installed in the control part 1A.

(Operation and Effect)

An operation and effect of the substrate processing apparatus 1 according to one embodiment of the present disclosure will now be described.

The substrate processing apparatus 1 according to one embodiment of the present disclosure includes: the slit 101 formed in the sidewall opposite to the injector 60 via the wafer boat 28 in the inner tube 8; and the rectifying plates 102 formed in the outer wall of the inner tube 8 or the inner wall of the outer tube 6 in the space between the slit 101 and the gas outlet 36 in the circumferential direction of the processing vessel 4. Furthermore, each of the rectifying plates 102 is installed to extend upward from a position below the lower end of the wafer boat 28 up to a position corresponding at least to the lower end of the slit 101, in the vertical direction of the processing vessel 4.

With this configuration, some of the process gas flowing from the inner tube 8 to the space between the inner tube 8 and the outer tube 6 through the slit 101 are discharged through the gas outlet 36 after the flow of the process gas is changed by the rectifying plates 102, instead of linearly reaching the gas outlet 36.

Specifically, as shown in FIG. 5, some of the process gas flowing from the upper portion of the slit 101 to the space between the inner tube 8 and the outer tube 6 are discharged through the gas outlet 36 substantially without being influenced by the rectifying plates 102. On the contrary, some of the process gas flowing from the lower portion of the slit 101 to the space between the inner tube 8 and the outer tube 6 flow upward while bypassing the rectifying plates 102, and subsequently, flow downward toward the gas outlet 36 at upper ends of the rectifying plates 102, so that the process gas is discharged through the gas outlet 36.

Thus, according to the substrate processing apparatus 1 with the gas outlet 36 formed below the processing vessel 4, it is possible to suppress the process gas introduced into the processing vessel 4 from flowing downward inside the inner tube 8. That is to say, it is possible to suppress the flow of the process gas from being biased to one side within the processing vessel 4. This improves in-plane uniformity when performing a heat treatment with respect to the plurality of wafers W accommodated in the processing vessel 4.

Furthermore, in the substrate processing apparatus 1, one or more disk-shaped members 29 are installed between the ceiling plate 28a of the wafer boat 28 and the upper region in which some of the plurality of wafers W is held, and between the bottom plate 28b of the wafer boat 28 and the lower region in which some of the plurality of wafers W is held, respectively. With this configuration, a vertically-upward orientation of the process gas in the vicinity of the upper end of the wafer boat 28 tends to be weakened, and a vertically-downward orientation of the process gas in the vicinity of the lower end of the wafer boat 28 tends to be weakened. Furthermore, since one or plural disk-shaped members 29 are also installed in the middle portion of the wafer boat 28 in the vertical direction, a vertically-downward orientation of the process gas in the vicinity of the middle portion of the wafer boat 28 tends to be weakened. This allows the flow of the process gas supplied from the gas supply holes 61 to be substantially in parallel with respect to the horizontal direction of the wafer boat 28. That is to say, it is possible to suppress the flow of the process gas from being biased to one side within the processing vessel 4. This improves in-plane uniformity when performing a heat treatment with respect to the plurality of wafers W accommodated in the processing vessel 4. Although in the above embodiment, three disk-shaped members 29 have been described to be used, the number of the disk-shaped members 29 may be increased to correspond to a plurality of divided regions in each of which the wafers W are held. Such an embodiment has the same effect as the embodiment as described above.

EXAMPLES

A simulation was performed to check a flow of gas (hereinafter also referred to as a "gas stream") when supplying a process gas from the injector 60 toward the wafer boat 28, using a model in which the wafer boat 28, the injector 60, and the gas outlet 36 are installed in the processing vessel 4. A wafer boat capable of mounting wafers W having a diameter of 300 mm thereon was used as the wafer boat 28.

Example 1

Figure 6A:
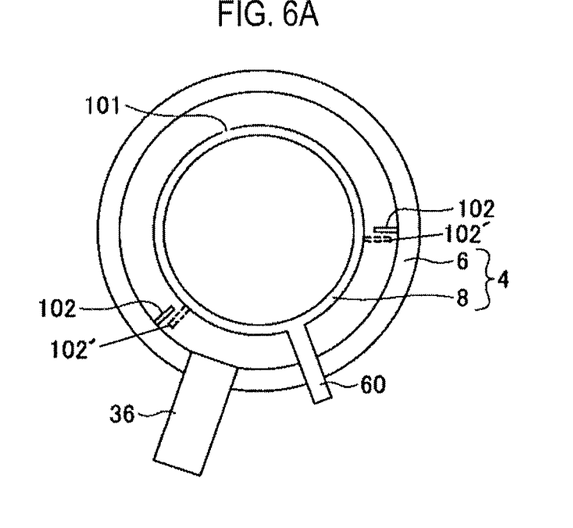
FIGS. 6A and 6B are schematic views of a substrate processing apparatus used in the Simulation of Example 1.
Figure 6B:
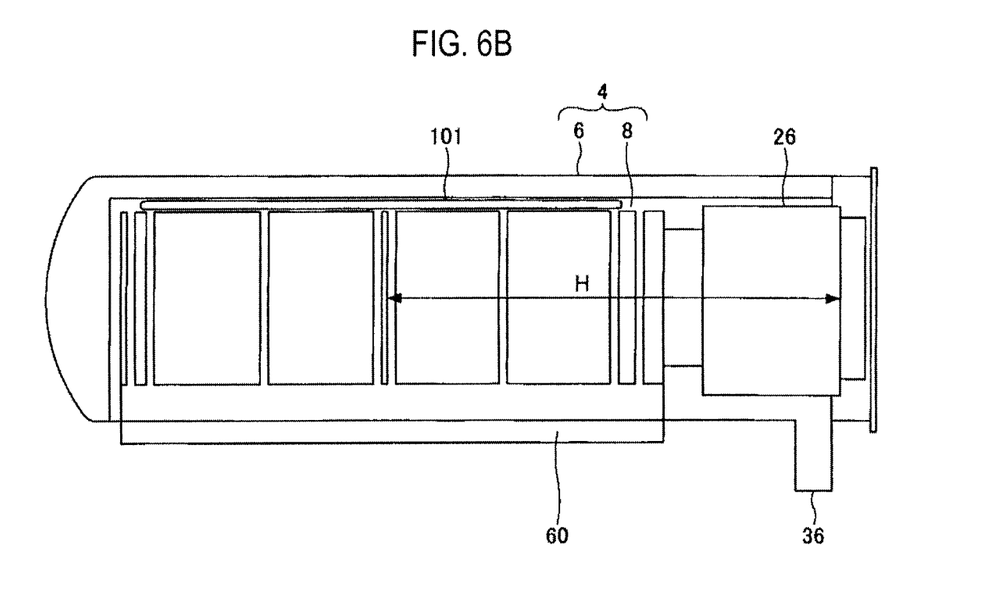

FIG. 6 is a schematic view of a substrate processing apparatus used in Simulation of Example 1. Specifically, FIGS. 6A and 6B are a schematic plan view and a schematic longitudinal sectional view of the substrate processing apparatus used in Simulation of Example 1, respectively.

Figure 7:
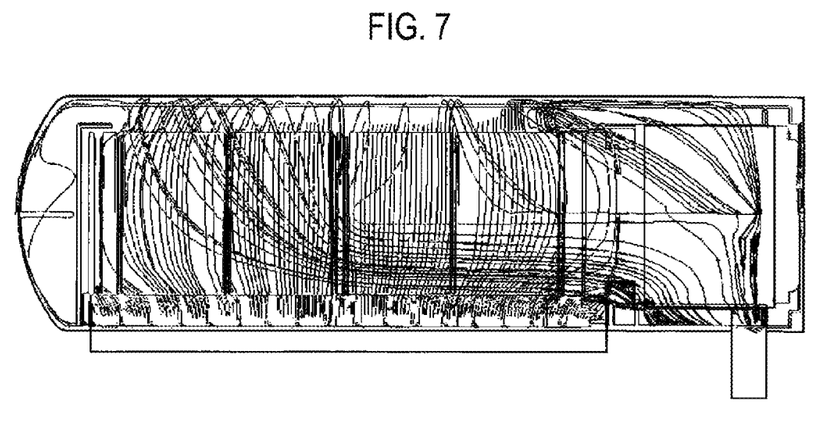
FIG. 7 is a characteristic diagram showing a simulation result of a gas stream in Example 1.

In Example 1, as shown in FIG. 6, a slit 101 (width: 50 mm) was formed in a sidewall opposite to the injector 60 in an inner tube 8 along a vertical direction of the processing vessel 4. Furthermore, rectifying plates 102 were installed to protrude toward an outer wall of the inner tube 8 in an inner wall of the outer tube 6 in a space defined between the slit 101 and the gas outlet 36 along a circumferential direction of the processing vessel 102, wherein a longitudinal direction of the rectifying plate 102 corresponds to the vertical direction of the processing vessel 4. A length of the rectifying plate 102 in the vertical direction was defined as a length (indicated by H in FIG. 6) from a lower surface of a heat insulating tube 26 up to a position corresponding to a middle portion of the wafer boat 28 in the vertical direction FIG. 7 is a characteristic graph showing a simulation result of a gas stream performed in Example 1. In FIG. 7, the gas stream inside the processing vessel 4 is indicated by solid lines.

As shown in FIG. 7, Example 1 shows that a vertically-downward orientation of the gas stream in the vicinity of the slit 101 tends to be weakened so that the gas stream supplied from the injector 60 is substantially in parallel with respect to the horizontal direction of the wafer boat 28. That is to say, in Example 1, it was believed that it was possible to suppress the flow of gas from being biased to one side within the processing vessel 4.

Example 2

Figure 8A:
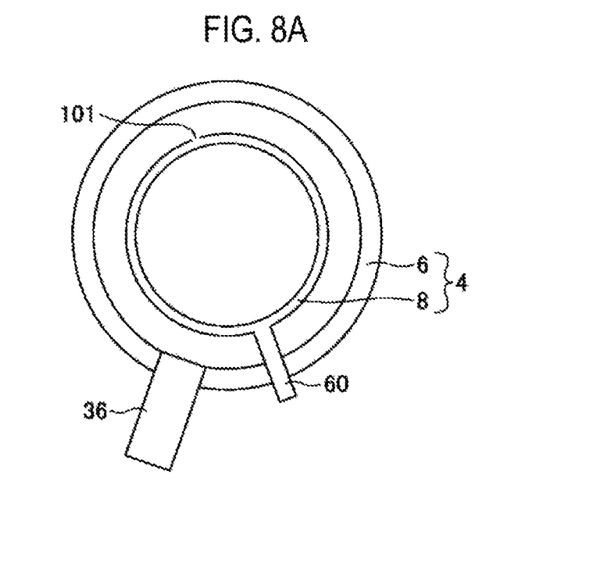
FIGS. 8A and 8B are schematic views of a substrate processing apparatus used in the Simulation of Example 2.
Figure 8B:
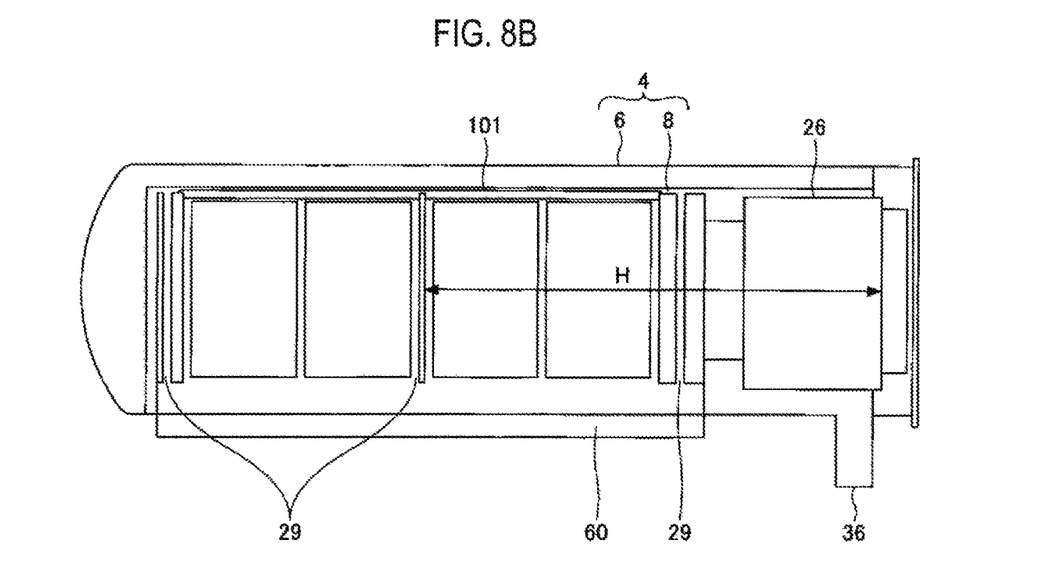

FIG. 8 is a schematic view of a substrate processing apparatus used in the Simulation of Example 2. Specifically, FIGS. 8A and 8B are a schematic plan view and a schematic longitudinal sectional view of the substrate processing apparatus used in the Simulation of Example 2, respectively.

In Example 2, as shown in FIG. 8, a slit 101 (width: 50 mm) was formed in a sidewall opposite to the injector 60 in an inner tube 8 along a vertical direction of the processing vessel 4. Furthermore, two disk-shaped members 29 were installed in each of an upper end portion, a middle portion and a lower end portion of the wafer boat 28 in the vertical direction thereof. The size of the disk-shaped member 29 was set to have an outer diameter greater than that of the wafer W and not interfering with the inner tube 8.

Figure 9:
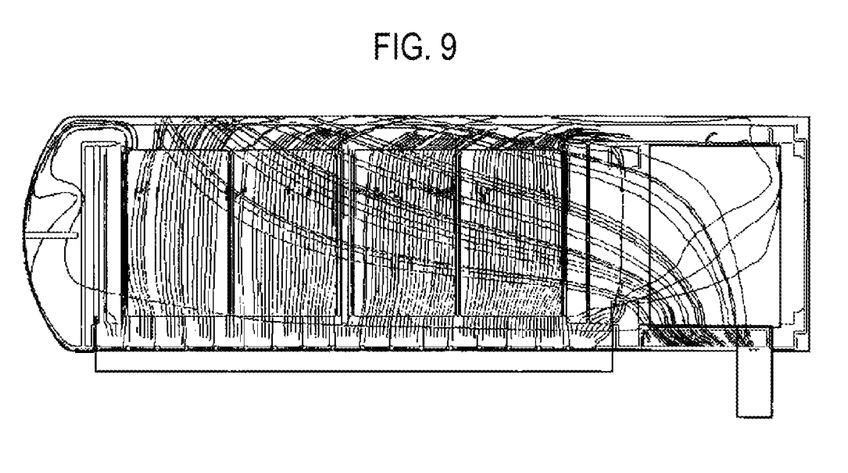
FIG. 9 is a characteristic diagram showing a simulation result of a gas stream in Example 2.

FIG. 9 is a characteristic diagram showing a simulation result of a gas stream in Example 2. In FIG. 9, the gas stream inside the processing vessel 4 is indicated by solid lines.

As shown in FIG. 9, Example 2 shows that a vertically-downward orientation of the gas stream in the vicinity of the upper end portion of the wafer boat 28 tends to be weakened and a vertically-downward orientation of the gas stream in the vicinity of the lower end portion of the wafer boat 28 tends to be weakened. Example 2 shows that the gas stream supplied from the injector 60 is substantially in parallel with respect to the horizontal direction of the wafer boat 28. That is to say, in Example 2, it was believed that it was possible to suppress the flow of gas from being biased to one side within the processing vessel 4.

Example 3

Figure 10A:
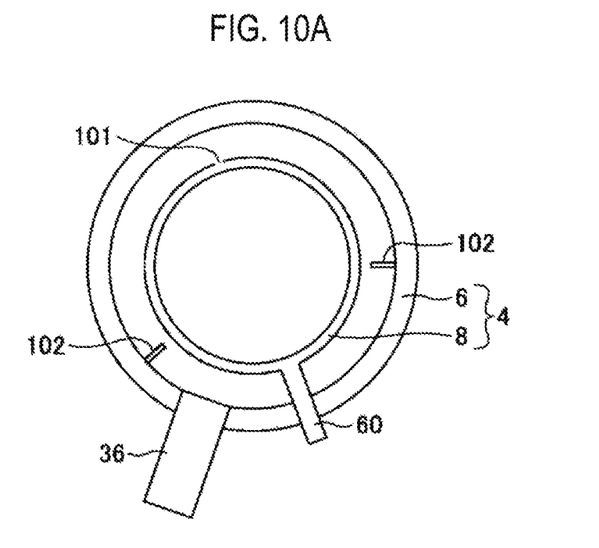
FIGS. 10A and 10B are schematic views of a substrate processing apparatus used in the Simulation of Example 3.
Figure 10B:
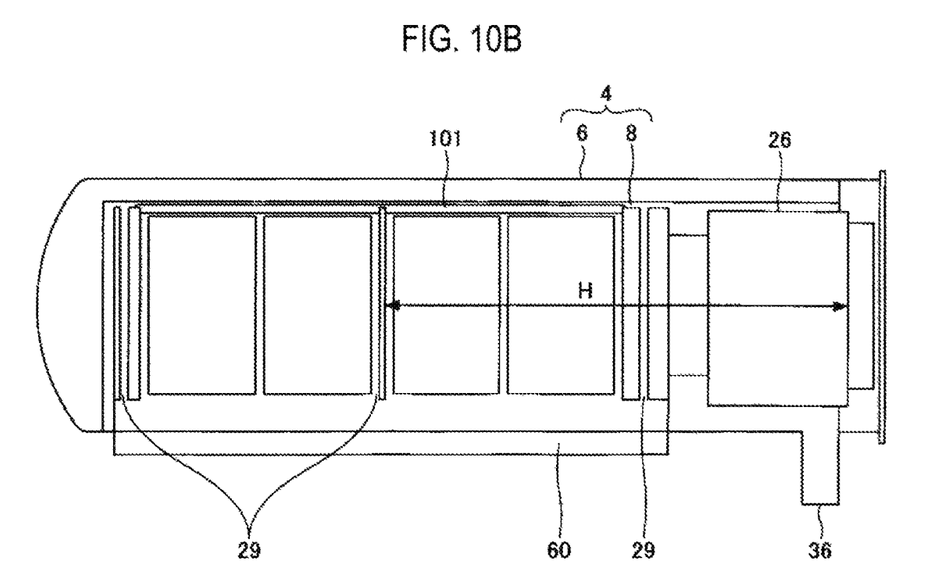

FIG. 10 is a schematic view of a substrate processing apparatus used in the Simulation of Example 3. Specifically, FIGS. 10A and 10B are a schematic plan view and a schematic longitudinal sectional view of the substrate processing apparatus used in the Simulation of Example 3, respectively.

In Example 3, as shown in FIG. 10, a slit 101 (width: 50 mm) was formed in a sidewall opposite to the injector 60 in an inner tube 8 along the vertical direction of the processing vessel 4. Furthermore, rectifying plates 102 were installed to protrude toward an outer wall of the inner tube 8 in an inner wall of the outer tube 6 in a space defined between the slit 101 and the gas outlet 36 along a circumferential direction of the processing vessel 102, wherein a longitudinal direction of the rectifying plate 102 corresponds to the vertical direction of the processing vessel 4. Furthermore, two disk-shaped members 29 were installed in each of an upper end portion, a middle portion and a lower end portion of the wafer boat 28 in the vertical direction thereof. The rectifying plate 102 was set to have the same configuration as that in Example 1 and the disk-shaped member 29 was set to have the same size as that in Example 2. In other words, Example 3 corresponds to a combination of Example 1 and Example 2.

Figure 11:
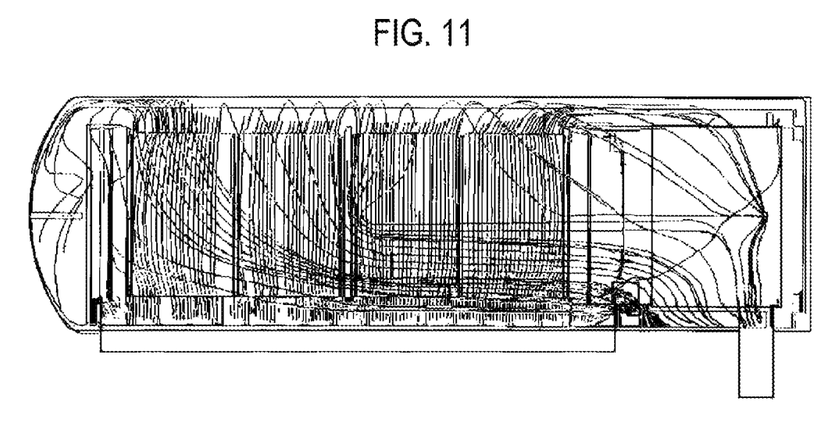
FIG. 11 is a characteristic diagram showing a simulation result of a gas stream in Example 3.

FIG. 11 is a characteristic diagram showing a simulation result of a gas stream in Example 3. In FIG. 11, the gas stream inside the processing vessel 4 is indicated by solid lines.

As shown in FIG. 11, Example 3 shows that a vertically-downward orientation of the gas stream in the vicinity of the slit 101 tends to be weakened so that the gas stream supplied through the gas supply holes 61 is substantially in parallel with respect to the horizontal direction of the wafer boat 28. Furthermore, Example 3 shows that a vertically-upward orientation of the gas stream in the vicinity of the upper end portion of the wafer boat 28 tends to be weakened and that a vertically-downward orientation of the gas stream in the vicinity of the lower end portion of the wafer boat 28 tends to be weakened. Further, Example 3 shows that the gas stream supplied from the injector 60 is substantially in parallel with respect to the horizontal direction of the wafer boat 28. In other words, in Example 3, it was believed that it was possible to suppress the flow of gas from being biased to one side within the processing vessel 4.

Comparative Example

Figure 12:
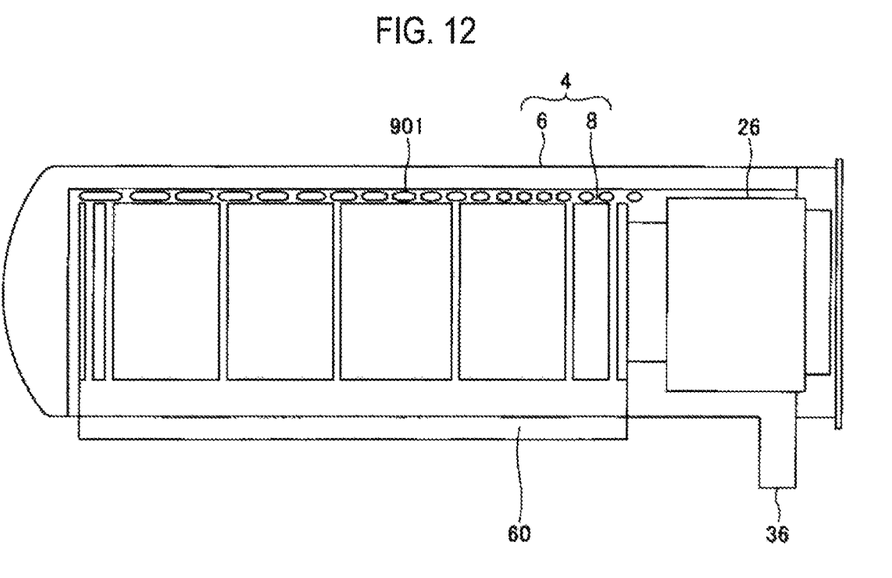
FIG. 12 is a schematic view of a substrate processing apparatus used in the Simulation of a Comparative Example.

FIG. 12 is a schematic view of a substrate processing apparatus used in the Simulation of a Comparative Example.

Specifically, FIG. 12 is a schematic longitudinal sectional view of the substrate processing apparatus used in the Simulation of a Comparative Example.

The Comparative Example was different from Examples 1 to 3 in that openings which are gradually downsized as it goes from top to bottom are formed instead of the slit 101, and the rectifying plates 102 and the disk-shaped members 29 were omitted.

Figure 13:
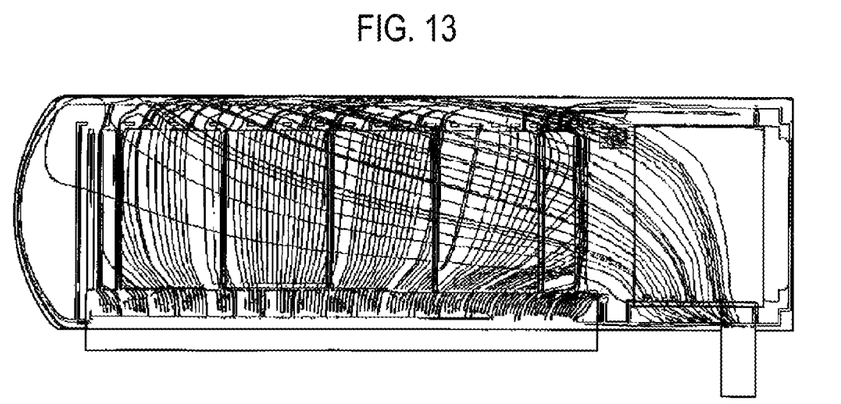
FIG. 13 is a characteristic diagram showing a simulation result of a gas stream in the Comparative Example.

FIG. 13 is a characteristic diagram depicting a simulation result of a gas stream in the Comparative Example. In FIG. 13, the gas stream inside the processing vessel 4 is indicated by solid lines.

As shown in FIG. 13, the Comparative Example shows that a flow of gas supplied from the injector 60 was significantly bent with respect to the horizontal direction of the wafer boat 28. Furthermore, the Comparative Example shows that the flow of gas in the vicinity of the lower end portion of the wafer boat 28 in the vertical direction was significantly biased to a position at the gas outlet 36 is formed. In other words, in the Comparative Example, it was believed that the flow of gas within the processing vessel 4 was significantly biased.

According to the present disclosure in some embodiments, it is possible to suppress a flow of gas from being biased to one side within a processing vessel.

While certain embodiments of a substrate processing apparatus have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a substrate holder configured to hold a plurality of substrates in a shelf formation;
   a processing vessel including an inner tube having a ceiling and configured to accommodate the plurality of substrates and the substrate holder, and an outer tube disposed outside the inner tube;
   a gas supply part configured to supply a process gas in parallel with respect to target surfaces of the plurality of substrates accommodated in the processing vessel;
   an exhaust part configured to exhaust the process gas from the processing vessel through a gas outlet;
   an exhaust port formed in a sidewall opposite to the gas supply part via the substrate holder in the inner tube, so that the process gas is exhausted through the exhaust port from the inner tube toward the gas outlet by the exhaust part; and
   a rectifying plate installed in an outer wall of the inner tube or an inner wall of the outer tube between the exhaust port and the gas outlet in a circumferential direction of the processing vessel such that a circumferential direction flow of the process gas exhausted from the exhaust port is suppressed,
   wherein the rectifying plate is installed to extend upward from a position below a lower end of the substrate holder to a location corresponding at least to a lower end of the exhaust port in a vertical direction of the processing vessel, such that the process gas flowing from a lower portion of the exhaust port to a space between the inner tube and the outer tube flows upward while bypassing the rectifying plate, and subsequently, flows downward toward the gas outlet after bypassing the rectifying plate.

2. The substrate processing apparatus of claim 1, wherein the rectifying plate is installed to extend upward from a position below a lower end of the substrate holder to a position corresponding at least to a middle portion of the substrate holder.

3. The substrate processing apparatus of claim 1, wherein the exhaust port is a slit whose upper end is placed above an uppermost wafer among the wafers held by the substrate holder and whose lower end is placed below a lowermost wafer among the wafers held by the substrate holder.

4. The substrate processing apparatus of claim 1, wherein the exhaust port includes a plurality of openings which is arranged in the vertical direction of the processing vessel.

5. The substrate processing apparatus of claim 1, wherein the substrate holder includes:
   a ceiling plate;
   a bottom plate installed to face the ceiling plate;
   a column connecting between the ceiling plate and the bottom plate;
   an arm portion formed in the column and configured to hold the plurality of substrates; and
   disk-shaped members installed between the ceiling plate and the plurality of substrates and between the bottom plate and the plurality of substrates, each of the disk-shaped member having an outer diameter larger than that of each of the plurality of substrates.

6. The substrate processing apparatus of claim 5, wherein each of the disk-shaped members has a notch formed at a position corresponding to a position of the column such that the disk-shaped member is held by the arm portion.

7. The substrate processing apparatus of claim 1, wherein the rectifying plate is installed in the inner wall of the outer tube.

8. The substrate processing apparatus of claim 1, wherein a length of the rectifying plate when viewed from the top is 0.67 times or more in length from the inner wall of the outer tube to the outer wall of the inner tube.

* * * * *